US006448160B1

(12) United States Patent
Chang et al.

(10) Patent No.: US 6,448,160 B1
(45) Date of Patent: Sep. 10, 2002

(54) METHOD OF FABRICATING POWER RECTIFIER DEVICE TO VARY OPERATING PARAMETERS AND RESULTING DEVICE

(75) Inventors: Paul Chang, Saratoga; Geeng-Chuan Chern, Cupertino; Wayne Y. W. Hsueh, San Jose; Vladimir Rodov, Redondo Beach, all of CA (US)

(73) Assignee: APD Semiconductor, Inc., San Jose, CA (US)

( * ) Notice: Subject to any disclaimer, the term of this patent is extended or adjusted under 35 U.S.C. 154(b) by 0 days.

(21) Appl. No.: 09/544,730

(22) Filed: Apr. 6, 2000

Related U.S. Application Data

(63) Continuation-in-part of application No. 09/283,537, filed on Apr. 1, 1999, now Pat. No. 6,331,455.

(51) Int. Cl.[7] .................... H01L 21/44; H01L 21/332; H01L 21/8238; H01L 21/331; H01L 21/425
(52) U.S. Cl. .................... 438/527; 438/109; 438/134; 438/209; 438/350; 438/658
(58) Field of Search .................. 438/350, 206, 438/209, 212, 328, 658, 527, 109, 134, 268

(56) References Cited

U.S. PATENT DOCUMENTS

| | | | |
|---|---|---|---|
| 3,603,811 A | | 9/1971 | Day |
| 4,373,252 A | * | 2/1983 | Caldwell .................... 438/442 |
| 4,982,260 A | | 1/1991 | Chang et al. |
| 4,996,581 A | * | 2/1991 | Hamasaki .................... 257/592 |
| 5,430,315 A | | 7/1995 | Rumennik |
| 5,629,536 A | | 5/1997 | Heminger et al. |
| 5,643,809 A | * | 7/1997 | Lien ............................ 438/234 |
| 5,747,841 A | | 5/1998 | Ludikhuize |
| 5,751,025 A | | 5/1998 | Heminger et al. |
| 5,818,084 A | | 10/1998 | Williams et al. ............ 257/329 |
| 5,825,079 A | | 10/1998 | Metzler et al. ............. 257/653 |

(List continued on next page.)

FOREIGN PATENT DOCUMENTS

| | | | |
|---|---|---|---|
| EP | 0322040 A2 | * | 6/1989 |
| JP | 405082534 A | * | 4/1993 |
| JP | 405175206 A | * | 7/1993 |
| JP | 406061250 A | * | 3/1994 |
| JP | 406112149 A | * | 4/1994 |

OTHER PUBLICATIONS

Christiansen, Bob, "Synchronous Rectification Improves with Age," PCIM, Aug., 1998, 6 pp.

*Primary Examiner*—Matthew Smith
*Assistant Examiner*—Chuong A Luu
(74) *Attorney, Agent, or Firm*—Townsend and Townsend and Crew LLP; Henry K. Woodward (57) ABSTRACT

A semiconductor rectifying device which emulates the characteristics of a low forward voltage drop Schottky diode and which is capable of a variety of electrical characteristics from less than 1 A to greater than 1000 A current with adjustable breakdown voltage. The manufacturing process provides for uniformity and controllability of operating parameters, high yield, and readily variable device sizes. The device includes a semiconductor body with a guard ring on one surface to define a device region in which are optionally formed a plurality of conductive plugs. Between the guard ring and the conductive plugs are a plurality of source/drain, gate and channel elements which function with the underlying substrate in forming a MOS transistor. The channel regions are defined by using the photoresist mask for the gate oxide with the photoresist mask isotropically etched to expose a peripheral portion of the gate oxide (and gate electrode) with ions thereafter implanted through the exposed gate for forming the channel region. The source/drain (e.g. source) regions can be formed by ion implantation or by out-diffusion from a doped polysilicon layer.

17 Claims, 12 Drawing Sheets

U.S. PATENT DOCUMENTS

| | | | |
|---|---|---|---|
| 5,869,380 A | * | 2/1999 | Chang .................... 438/309 |
| 5,877,515 A | | 3/1999 | Ajit |
| 5,956,582 A | | 9/1999 | Ayela et al. |
| 6,034,385 A | | 3/2000 | Stephani et al. |
| 6,097,046 A | | 8/2000 | Plumton |
| 6,186,408 B1 | | 2/2001 | Rodov et al. |
| 6,225,180 B1 | * | 5/2001 | Fujii .......................... 438/350 |
| 6,235,601 B1 | * | 5/2001 | Kim ........................... 438/348 |
| 6,258,634 B1 | * | 7/2001 | Wang et al. ............... 438/133 |
| 6,313,001 B1 | * | 11/2001 | Johansson et al. ........ 438/340 |
| 6,323,091 B1 | * | 11/2001 | Lee et al. ................... 438/275 |
| 6,362,036 B1 | * | 3/2002 | Chiozzie et al. ........... 438/206 |

* cited by examiner

METHOD OF FABRICATING POWER RECTIFIER DEVICE TO VARY OPERATING PARAMETERS AND RESULTING DEVICE

CROSS-REFERENCES TO RELATED APPLICATIONS

This application is a continuation-in-part of application Ser. No. 09/283,537 filed Apr. 1, 1999 now U.S. Pat. No. 6,331,455 for "Power Rectifier Device", the diption of which is incorporated herein by reference.

BACKGROUND OF THE INVENTION

This invention relates generally to power semiconductor devices, and more particularly the invention relates to a power semiconductor rectifier device and a method of making same.

Power semiconductor rectifiers have a variety of applications including use in power supplies and power converters. Heretofore, Schottky diodes have been used in these applications. A Schottky diode is characterized by a low turn-on voltage, fast turnoff, and nonconductance when the diode is reverse biased. However, to create a Schottky diode a metal-silicon barrier must be formed. In order to obtain the proper characteristics for the Schottky diode, the barrier metal is likely different than the metal used in other process steps such as metal ohmic contacts. Further, Schottky diode rectifiers suffer from problems such as high leakage current and reverse power dissipation. Also, these problems increase with temperature causing reliability problems for power supply applications. Therefore, the design of voltage converters using Schottky barrier diodes can cause designer problems for many applications.

Figure 1:
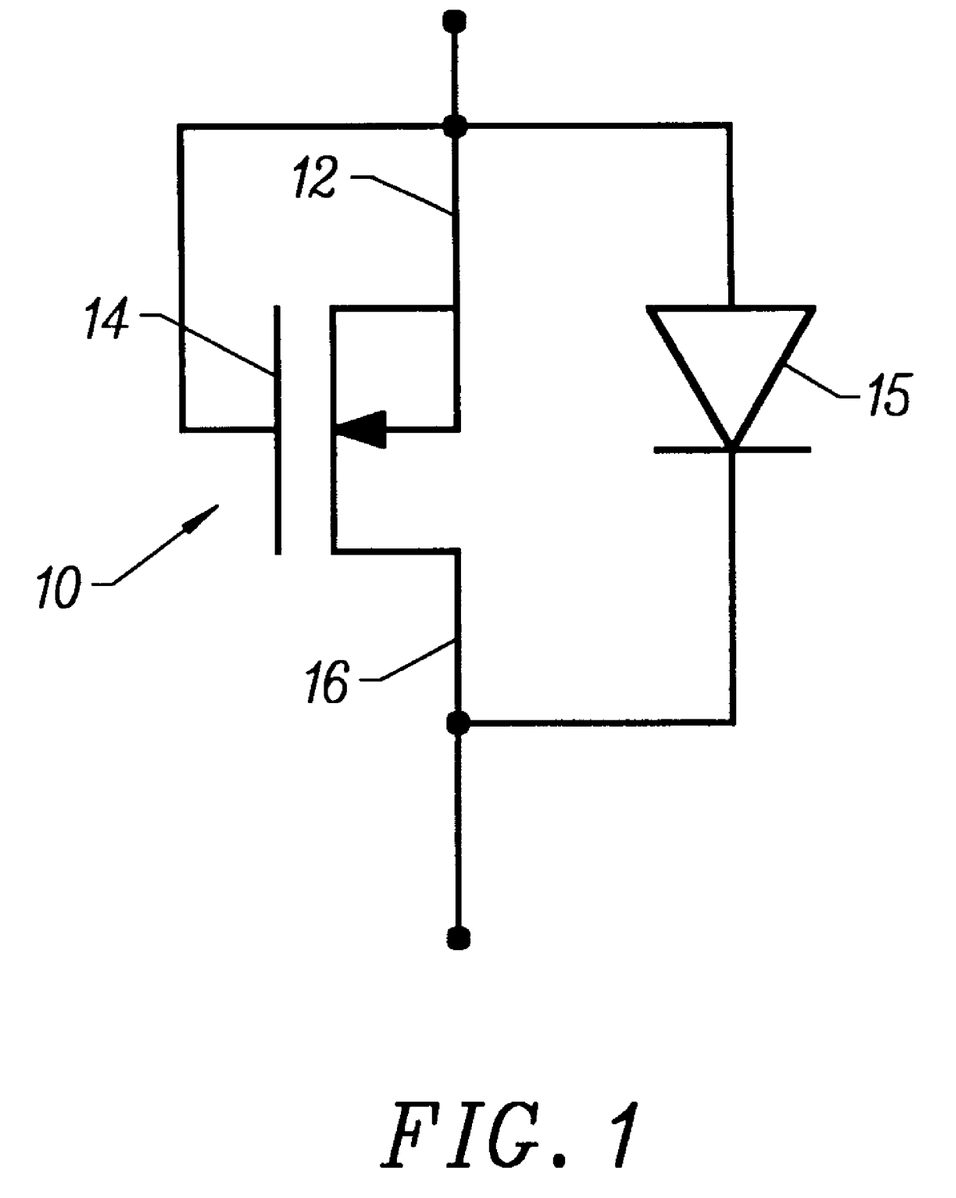
FIG. 1 is an electrical schematic of a power rectifier device to which the resent invention applies.

A semiconductor power rectifier device is known which does not employ Schottky barriers. FIG. 1 from U.S. Pat. No. 5,818,084 is a schematic of such a device which comprises a MOSFET transistor shown generally at 10 having a source/drain 12 which is shorted to a gate 14. A parasitic diode 16 is connected from the source/drain 12 to the drain/source 16. The patent discloses the use of a trench for accommodating the gate.

Copending application Ser. No. 09/283,537, supra, discloses a vertical semiconductor power rectifier device which employs a large number of parallel connected cells, each comprising a MOSFET structure with a gate-to-drain short via common metallization. This provides a low $V_f$ path through the channel regions of the MOSFET cells to the source region on the other side of the device. The method of manufacturing the rectifier device provides highly repeatable device characteristics at reduced manufacturing costs. The active channel regions of the device are defined using pedestals in a double spacer, double implant self-aligned process. The channel dimensions and doping characteristics may be precisely controlled despite inevitable process variations and spatial sidewall formation.

The present invention is directed to an improved method of manufacturing a semiconductor power rectifier device and the resulting structure. As used herein the term "source/drain" is used to include either source or drain depending on device connection.

SUMMARY OF THE INVENTION

In accordance with the invention a semiconductor power rectifier device is provided in which a semiconductor substrate functions as one source/drain (e.g. the drain) of the device and a plurality of second source/drain (e.g. source) regions are formed on a major surface of the substrate along with a plurality of gate electrodes with the source/drain and gate electrodes positioned within a guard ring and, optionally, conductive plugs in the major surface.

In preferred embodiments, the semiconductive rectifier device is fabricated using conventional semiconductor processing steps including photoresist masking, plasma etching, and ion implantation in forming the guard ring, conductive plugs, source/drain regions, and gate electrodes overlying device channel regions. In accordance with one feature of the invention, a photoresist mask used in defining the gate oxide and gate of the device is isotropically or otherwise etched to expose peripheral portions of the gate electrode through which ions are implanted to create channel regions in body regions under and controlled by the gate electrode.

In accordance with another feature of the invention, a multiple implant process is provided for creating a pocket around the source/drain (e.g. source) regions in the surface of the device and in forming the channel regions in the body regions underlying the gate electrode which allows controlled variations in device parameters.

In accordance with one embodiment of the invention, the source/drain regions are formed by out-diffusion of dopant from a doped polysilicon layer which functions in interconnecting the guard ring, conductive plugs, and gate electrodes.

The invention and objects and features thereof will be more readily apparent from the following detailed description and dependent claims when taken with the drawings.

DESCRIPTION OF THE ILLUSTRATIVE EMBODIMENTS

FIGS. 2A–2J are section views illustrating steps in fabricating a power rectifier device in accordance with a preferred embodiment of the invention. The resulting structure has a schematic as illustrated in FIG. 1 and comprises a plurality of rectifier elements or unit cells dispersed in a device region of a semiconductor body defined by a guard ring. Fabrication of the semiconductor rectifier device in accordance with the invention and using standard semiconductor processing techniques.

Figure 2A:
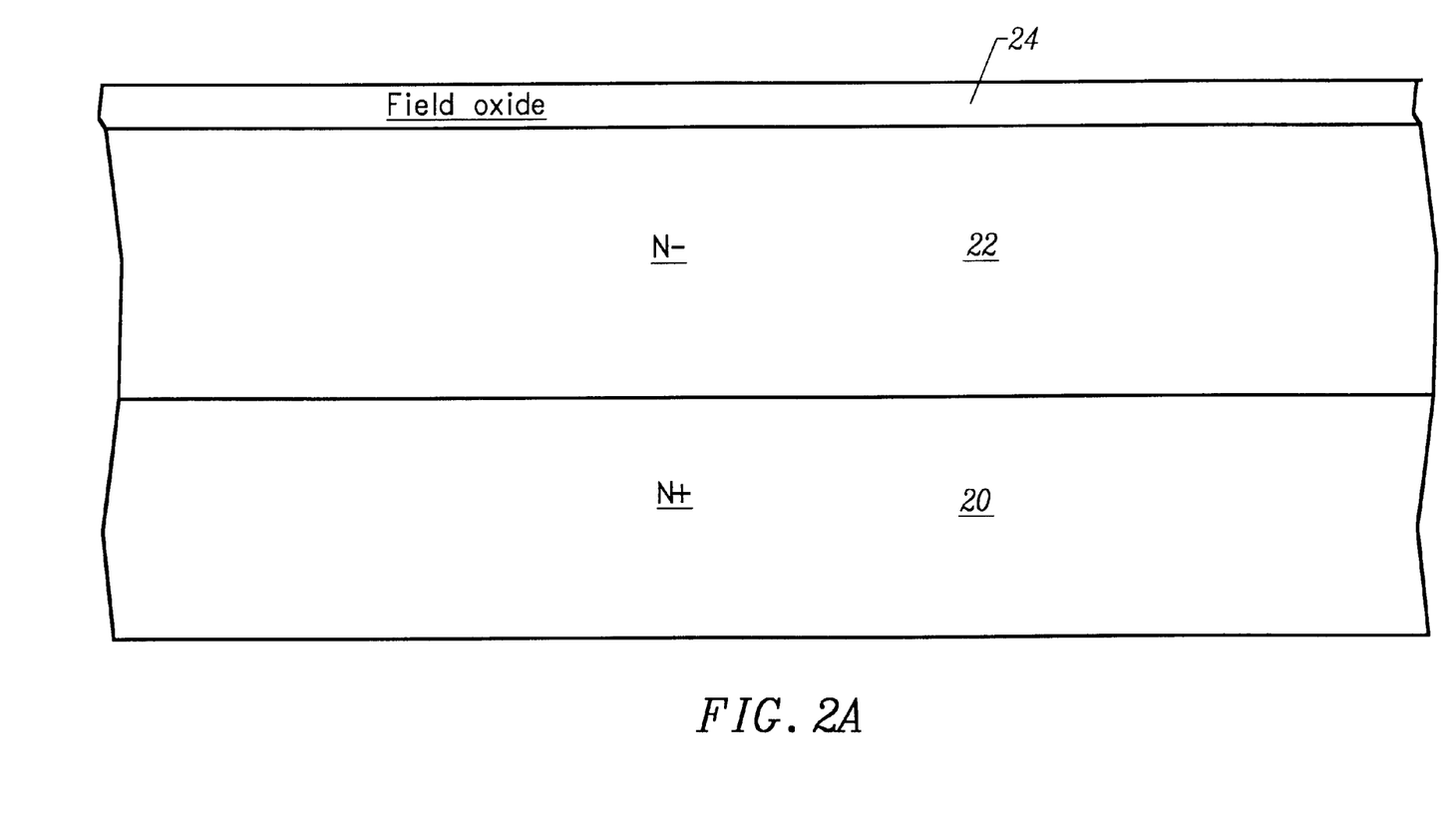
FIGS. 2A–2J are section views illustrating steps in fabricating a power rectifier device in accordance with a preferred embodiment of the invention.
Figure 2B:
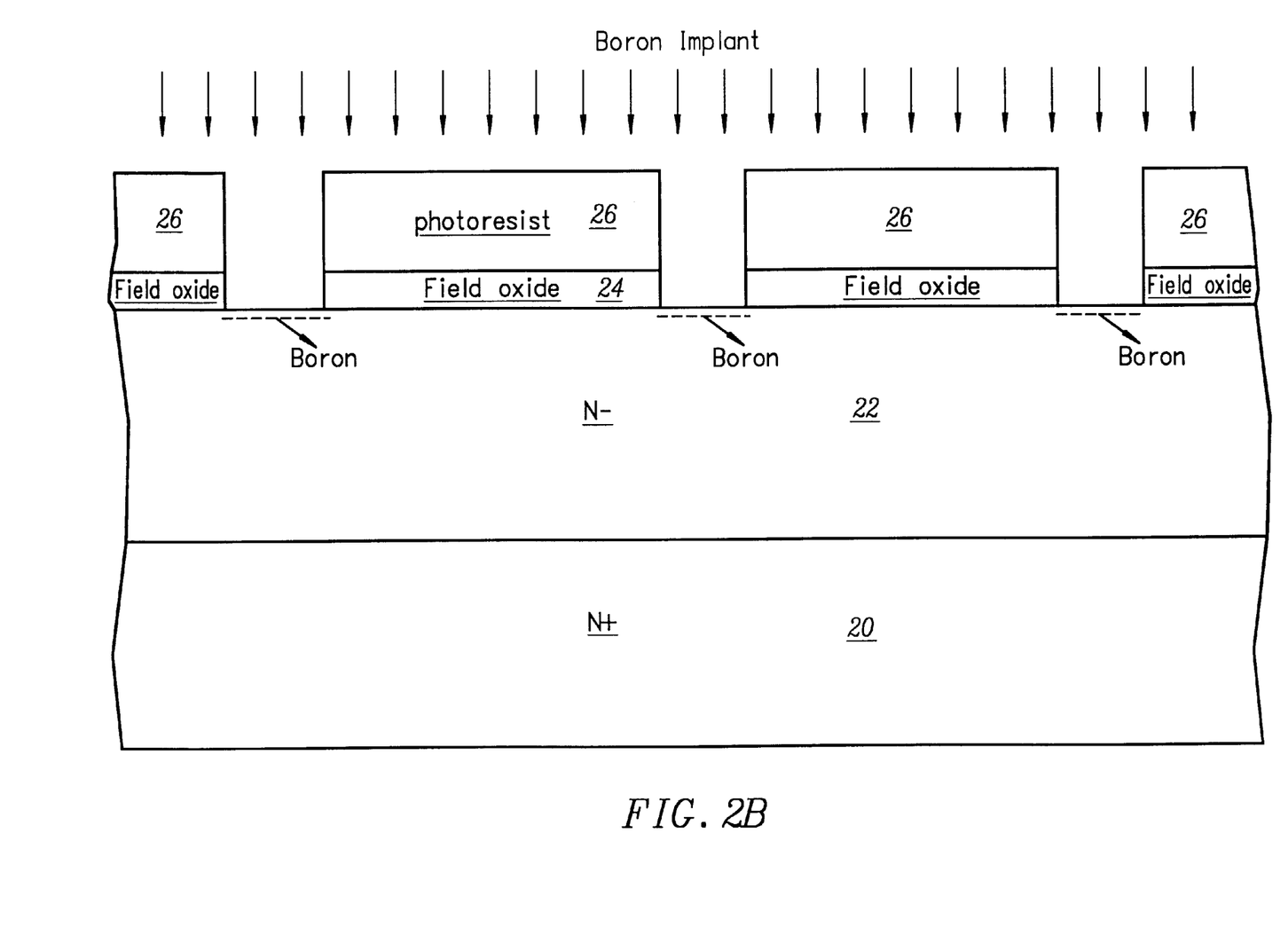
Figure 2C:
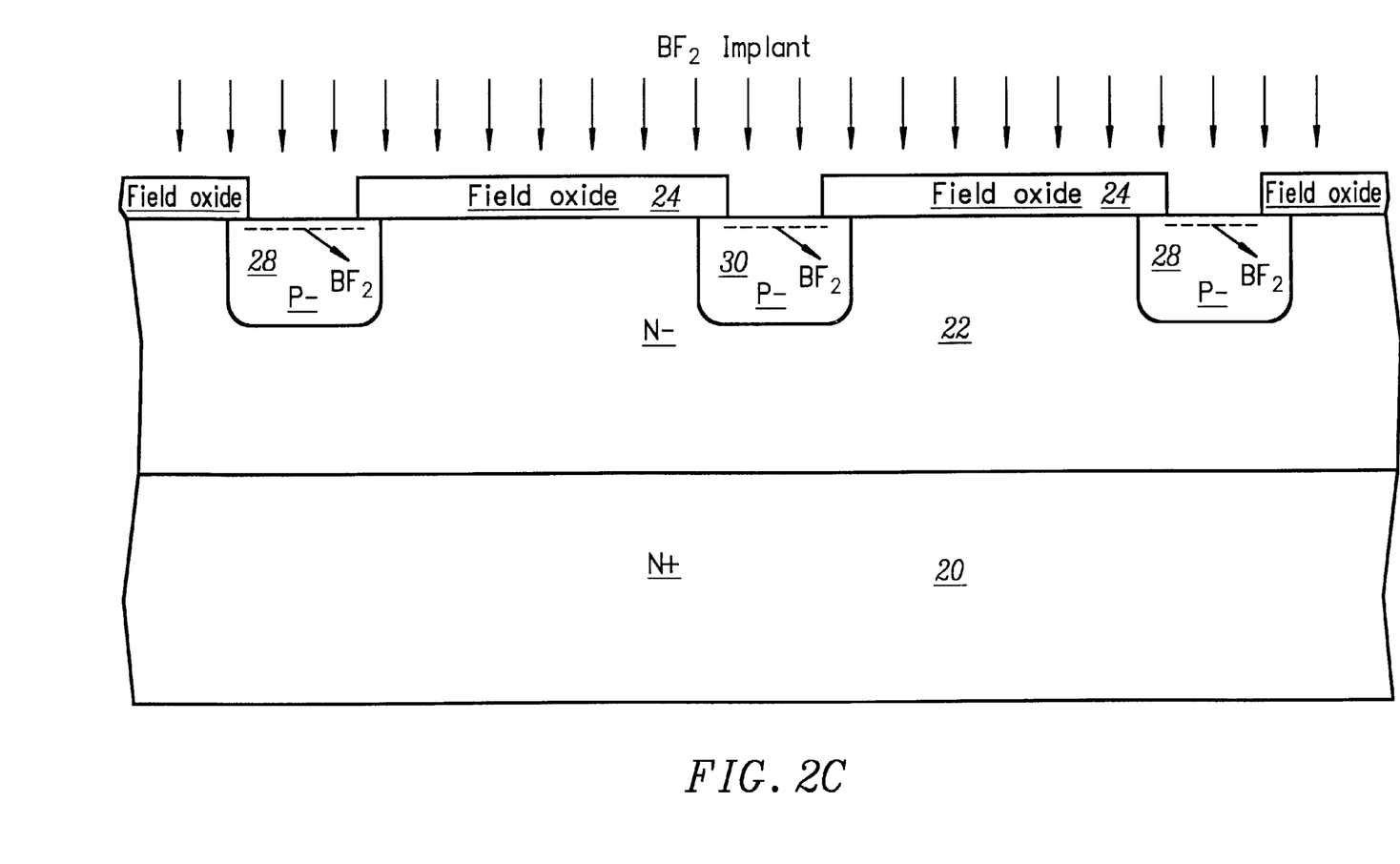

In FIG. 2A a semiconductor body is provided including an N+ substrate 20 on which is formed an N− semiconductor layer 22 having a resistivity on the order of 0.1–10 ohm cm. Field oxide 24 is grown or deposited on the surface of layer 22 to a thickness of 300–1000 nm. Thereafter, as shown in FIG. 2B a photoresist pattern 26 is selectively formed over field oxide 24 by photoresist masking and etching techniques, and a P-type dopant such as boron is then implanted in openings through the photoresist. The boron can be implanted before or after photoresist removal, and as shown in FIG. 2C a boron drive-in forms deep P-regions to form an annular guard ring 28 which defines a device region in layer 22 and, optionally, one or more P-doped conductive plugs 30 within the device region. Plugs 30 are not essential in the device, especially for small area rectifier devices in which the guard ring alone will suffice. Dopant concentration of the P-doped regions is on the order of E11–E14/cm². A second BF₂ is then made in the surface of the P-doped regions for high surface concentration (E12–E15/cm²) to form good ohmic contacts, and then the BF₂ is activated by rapid thermal annealing.

Figure 2D:
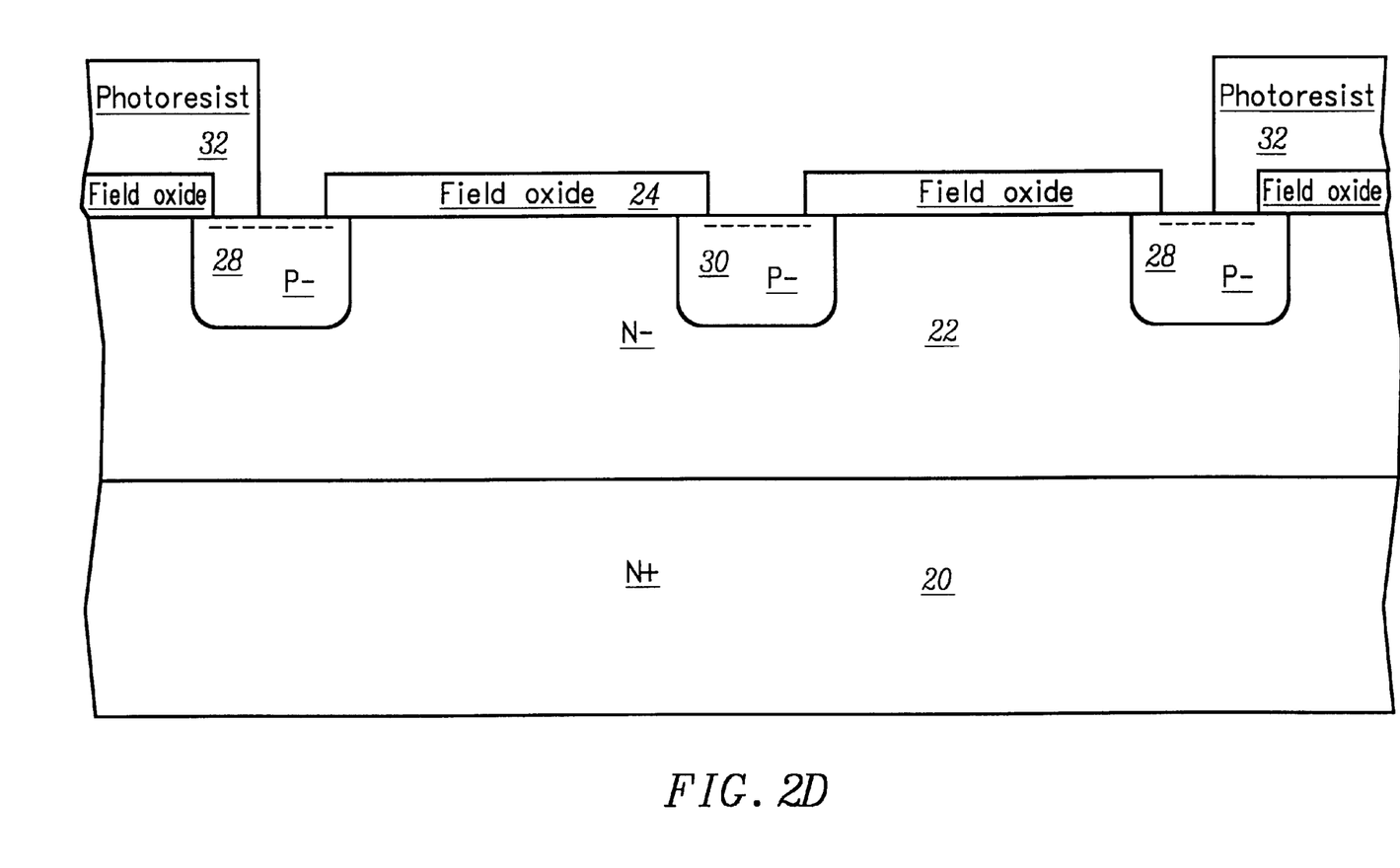
Figure 2E:
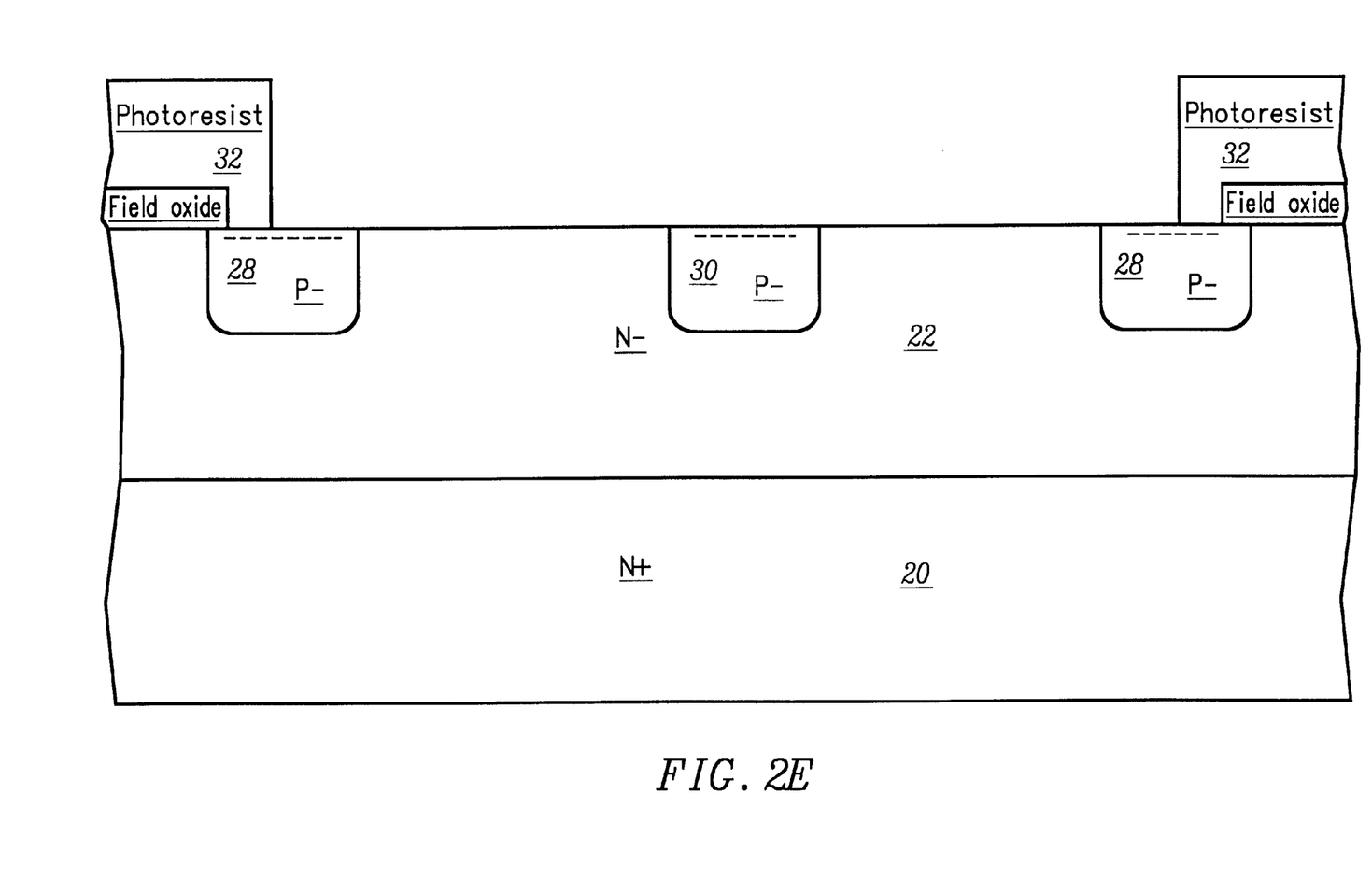
Figure 2F:
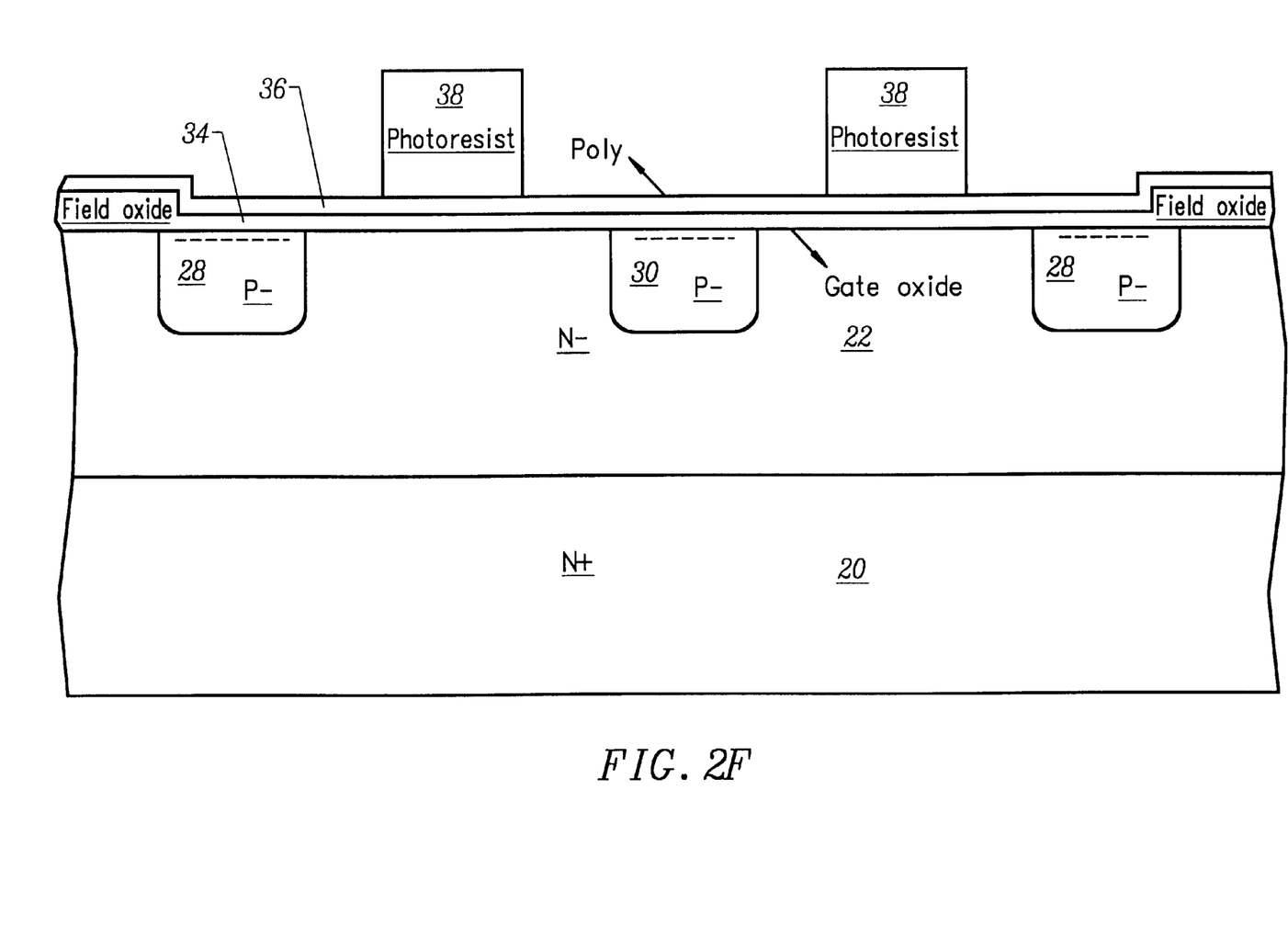

Next as shown in FIG. 2D a photoresist pattern 32 is developed to cover the area outside of the device region and then the field oxide 24 in the device region is removed by etching as shown in FIG. 2E. Thereafter, as shown in FIG. 2F photoresist 32 is removed and a gate oxide 34 of thickness of 5–50 nm is grown over the surface in the device region, and thereafter 10–80 mn polysilicon layer 36, either doped in situ or undoped with later implant doping, is deposited on gate oxide 34. The polysilicon layer is optional and unnecessary if a metal gate MOS structure is fabricated. A photoresist pattern 38 is then formed over the device region between the P-doped regions 28, 30 to form MOS transistor elements.

Figure 2G:
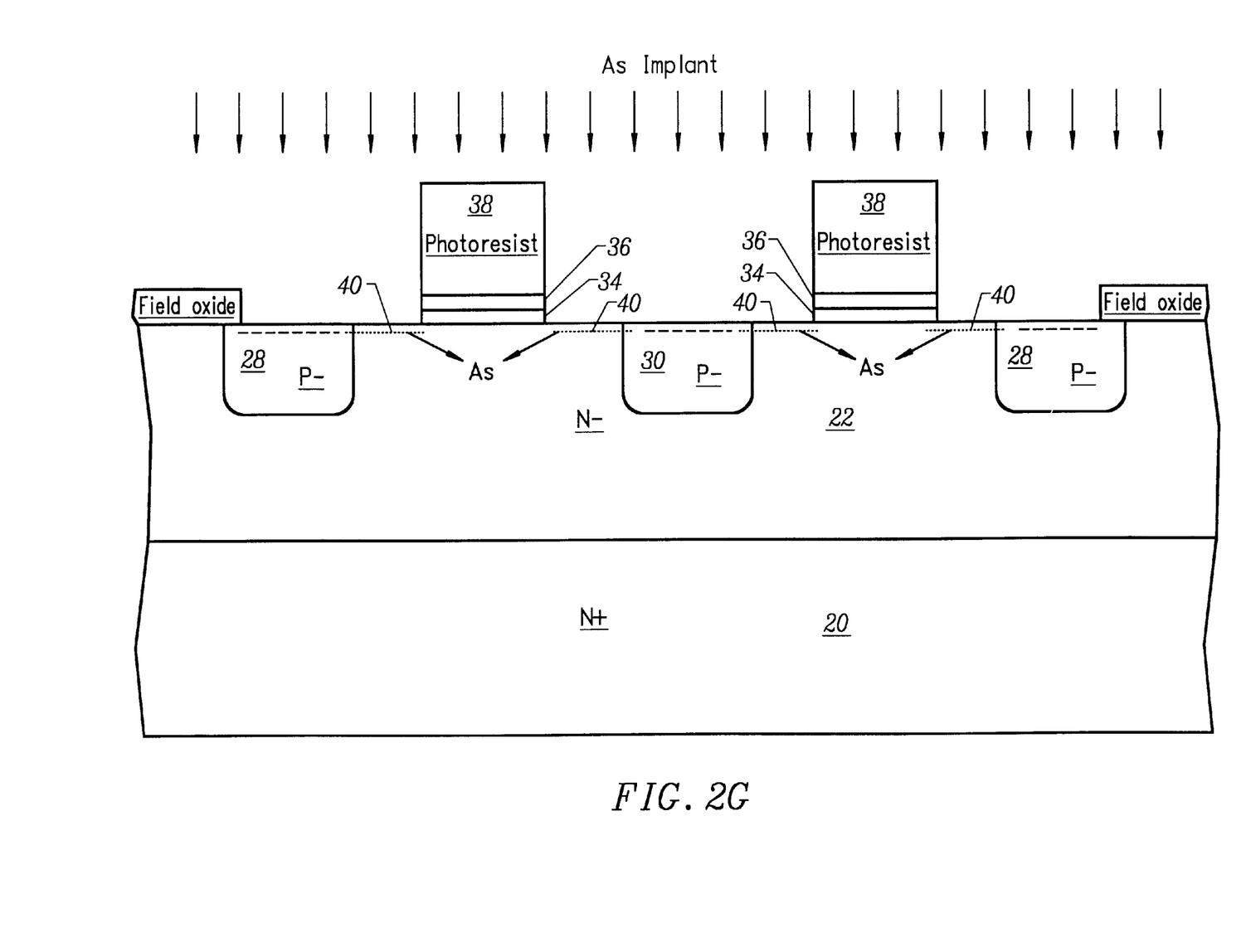
Figure 2H:
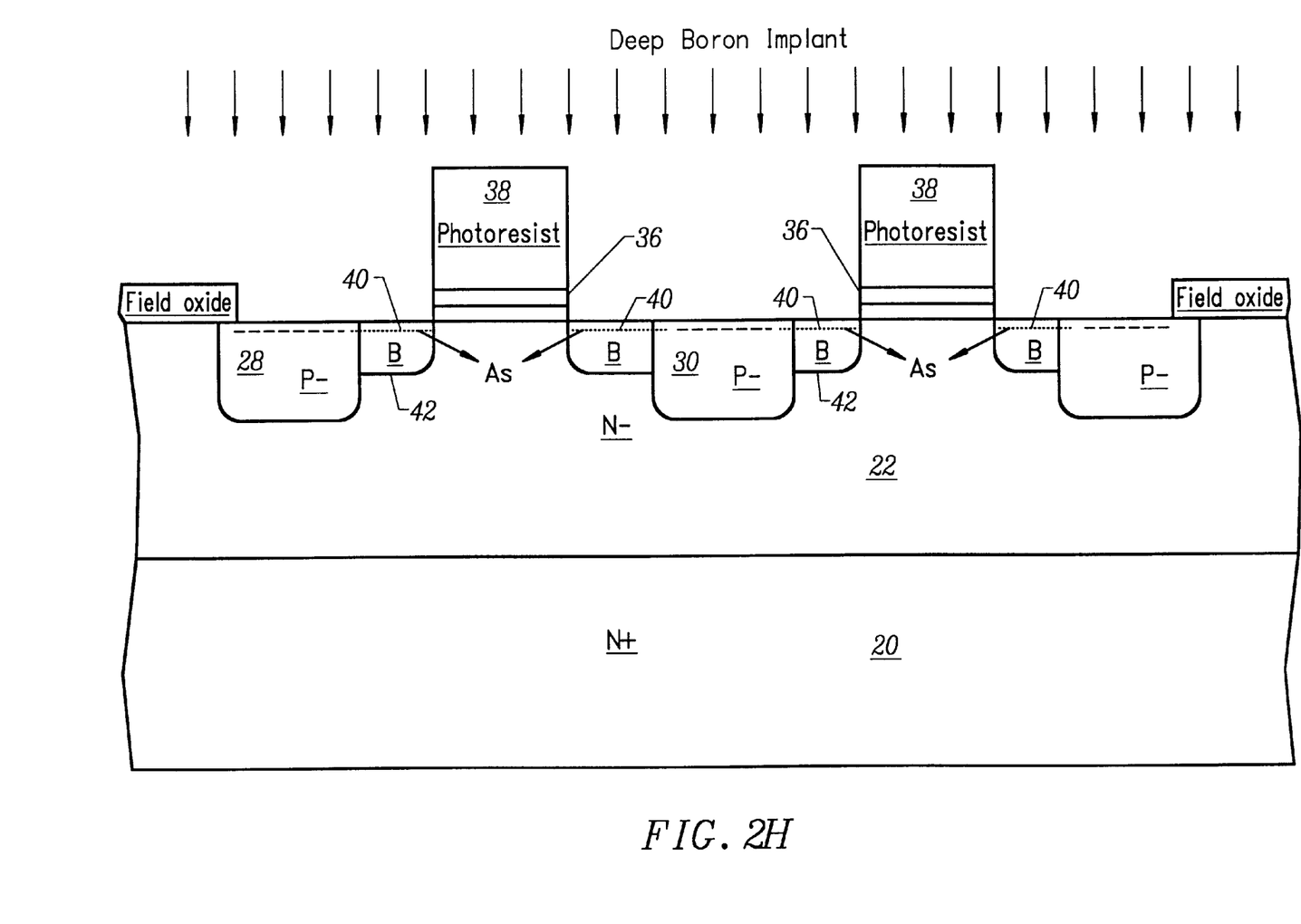

In FIG. 2G the exposed polysilicon 36 and gate oxide 34 is removed by etching using photoresist mask 38, leaving the gate oxide 34 and doped polysilicon gate 36 under photoresist mask 38. An N-type dopant such as arsenic is then implanted at 40 in the exposed semiconductor surface of sufficient concentration (E11–E14/cm²) to form a good ohmic contact. However, the arsenic should be about one order of magnitude lower than the BF₂ implant of FIG. 2C so that the net surface concentration in the guard ring and plug areas is still P+ with a value that is high enough to form a good P-type ohmic contact. Following the arsenic implant, a deep boron implant is optionally made as shown in FIG. 2H to create a deep boron pocket 42 surrounding the N+ arsenic regions 40. For low voltage device applications, the deep boron implant step is not necessary. The deep boron implant 42 can be performed before the arsenci implant.

Figure 2I:
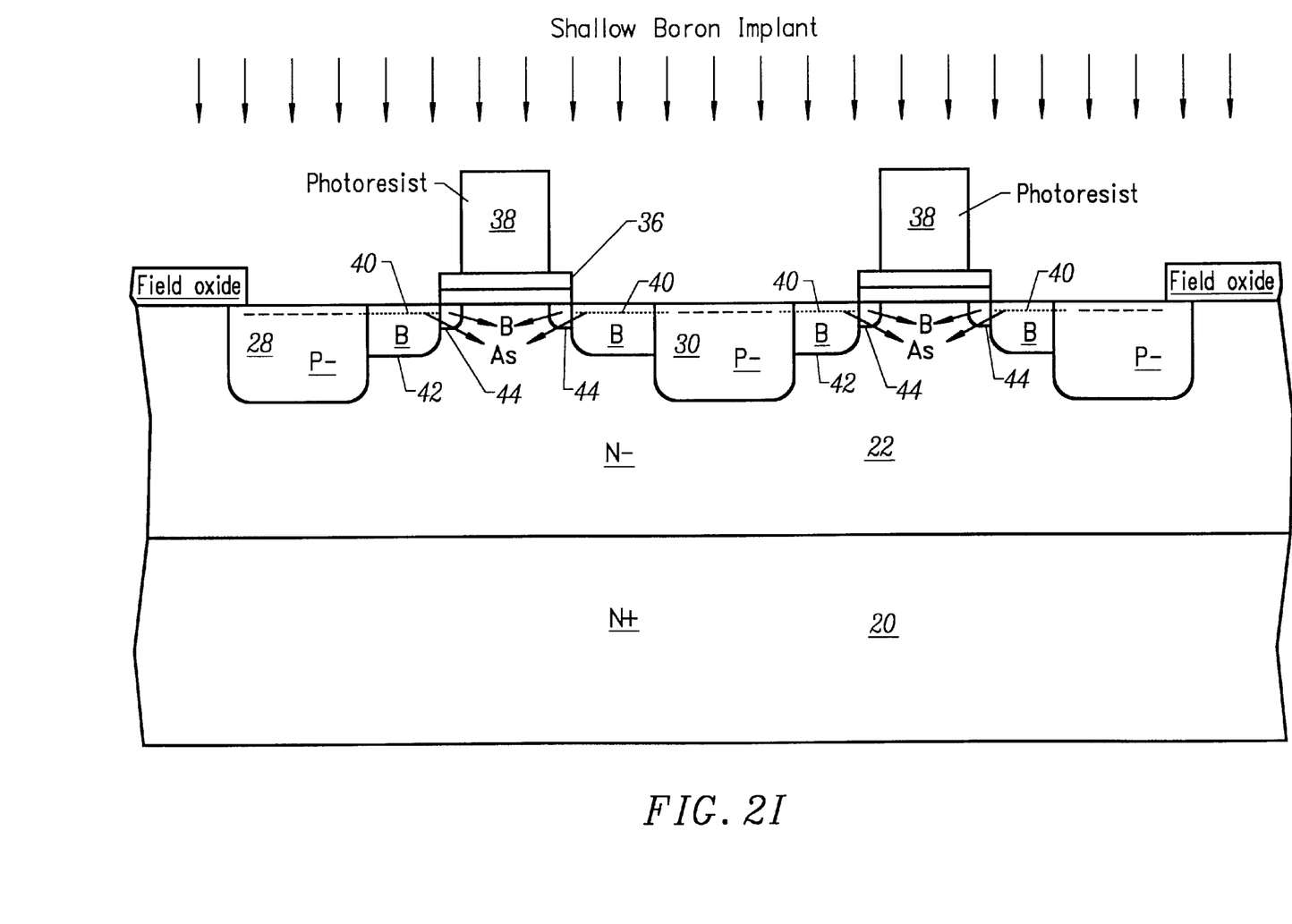

Thereafter, as shown in FIG. 2I, an etch such as an isotropic oxygen plasma etch removes about 10–400 nm of the photoresist mask 38, exposing an annular portion of the polysilicon gate 36, and then a shallow boron implant creates P-body regions 44 under gate contact 36 and abutting N+ source/drain regions 40. The shallow boron implant creates the body regions 44 and provides for the desired threshold voltage adjustment for the channel regions. Body region 44 and pocket 42 abut either guard ring 28 or plugs 30.

Figure 2J:
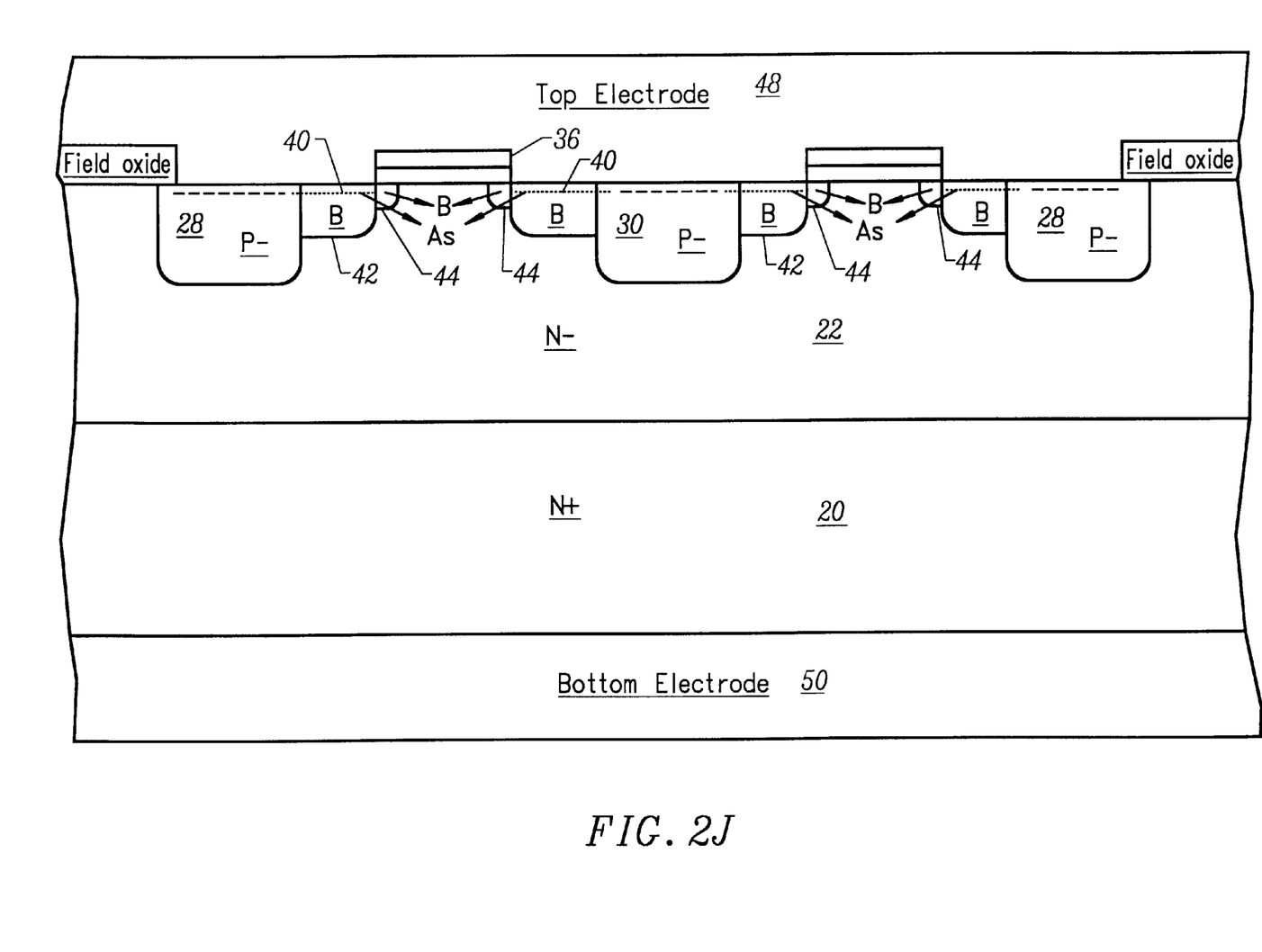

Referring to FIG. 2J, photoresist 38 is removed and rapid thermal annealing is employed to activate all implants. Thereafter a top electrode 48 is formed over the surface of the device region and electrically interconnects guard ring 28, plugs 30, source/drain (e.g. source) 40, and gate 36. Bottom electrode 50 engaging substrate 20 can be formed simultaneously with the formation of the top electrode 48 or separately, the materials for the top and bottom electrodes being Ti, TiN, Ni, Ag, Au, Cu, or combinations thereof or other suitable metals. Alternatively, the top electrode can comprise a doped polysilicon engaging the device region surface with a metal contact over the polysilicon. In alternative embodiments, the source/drain regions 40 can be formed by out-diffusion from the doped polysilicon layer, and the doped polysilicon layer can also function as the gate contact 36.

The resulting device is a vertical two terminal structure with a plurality of channel elements dispersed in the device region within the guard ring. The P doped plugs along with body regions 42 and guard ring 28 and N– epitaxial layer 22 form the parasitic diode 16 shown in FIG. 1. Due to the unit cell design, a large variety of devices can be manufactured with current capability of less than 1 A to greater than 1000 A with a same high production yield. The forward voltage, therefore, can be varied from less than 0.1 V and upward to a desired value and the leakage current can be adjusted accordingly. The reverse bias breakdown voltage is also adjustable from as low as 1 V up to hundreds of volts. In one embodiment the forward voltage, $V_f$, is 0.40 V for a reverse voltage, $V_r$, 45 V at the forward current density of 350 A/cm² with a reverse current density of 4E(–3)A/cm². Thus, a 65 mil square chip is capable of carrying 8 A current with a room temperature leakage current of 0.1 mA and 0.40 $V_f$ breakdown voltage of 45 V. The process provides uniformity and controllability of the device parameters with high yield, and provides the capability of production of very large area devices.

Figure 3:
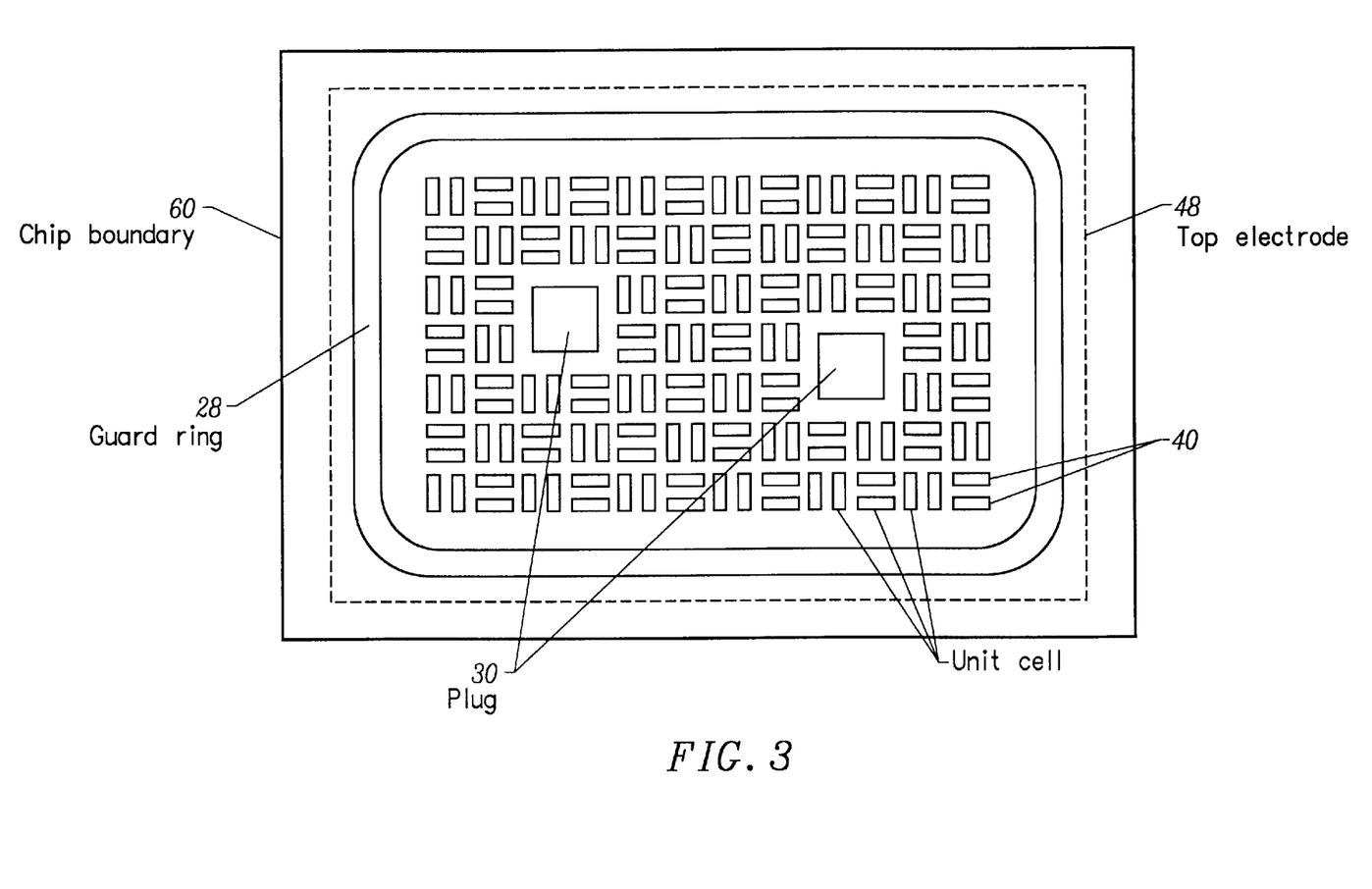
FIG. 3 is a plan view of the finished device of FIG. 2J.

FIG. 3 is a plan view of the semiconductor rectifier device and illustrates guard ring 28, plugs 30, unit cells with source/drains 40, and top electrode 48, and within a semiconductor chip 60 including substrate 20 and layer 22. The shape of the unit cells can be square, circular, a strip or other convenient shape.

While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A method of fabricating a semiconductor rectifier device comprising the steps of:
   a) providing a semiconductor substrate of first conductivity type and having opposing major surfaces,
   b) selectively doping regions in a first major surface with dopant of second conductivity type to form a guard ring of second conductivity type around a device region,
   c) forming a silicon oxide layer over the device region,
   d) forming a doped polysilicon layer over the silicon oxide layer,
   e) selectively forming a dopant mask material over areas of the doped polysilicon layer where device channel regions are to be formed,
   f) removing the exposed doped polysilicon layer and the underlyling silicon oxide layer from the device region thereby forming gate electrodes overlying gate silicon oxide under the dopant mask,
   g) doping the exposed first major surface with a dopant of first conductivity type to form source/drain regions, the dopant being insufficient to convert the guard ring to first conductivity type,
   h) etching the dopant mask to expose peripheral portions of the gate electrode,
   i) doping the major surface under the exposed peripheral portion of the gate electrode with dopant of the second conductivity type to form a body region of second conductivity type and channel region which abuts the source/drain regions,
   j) forming a first electrode over the first major surface interconnecting the guard ring, gate, and source/drain regions, and
   h) forming a second electrode over the second major surface contacting the substrate.

2. The method as defined by claim 1 wherein step b) includes thermal drive-in of the dopant of second conductivity type.

3. The method as defined by claim 2 and further including doping the surface of the guard ring with dopant of second conductivity type to increase the surface dopant concentration.

4. The method as defined by claim 1 wherein step j) includes forming a doped polysilicon layer over the first major surface.

5. The method as defined by claim 4 wherein step g) is performed in step j) by out-diffusing dopant from the doped polysilicon layer into the first major surface to form source/drain regions between the gate electrodes and the guard ring.

6. The method as defined by claim 1 wherein before step h) the first major surface is doped with a dopant of second conductivity type to create a doped pocket surrounding the source/drain regions for increasing reverse bias breakdown voltage.

7. The method as defined by claim 1 wherein step e) forms a photoresist dopant mask.

8. The method as defined by claim 7 wherein step h) isotropically etches the photoresist with an oxygen plasma etch.

9. The method as defined by claim 1 wherein all doping steps are by ion implantation and thermal drive-in.

10. The method as defined by claim 9 wherein the first conductivity is N-type and the second conductivity type is P-type.

11. The method as defined by claim 10 wherein the P-type dopant includes boron and the N-type dopant includes arsenic.

12. The method as defined by claim 1 wherein step b) includes use of a photoresist mask.

13. The method as defined by claim 1 wherein step a) includes providing a semiconductor substrate including an epitaxial layer grown on an underlying body.

14. The method as defined by claim 1 wherein step b) includes forming at least one doped plug within the device region of the second conductivity type.

15. A semiconductor rectifying device made by the method defined by claim 1.

16. A method of fabricating a semiconductor rectifying device comprising the steps of
   a) providing a semiconductor substrate of a first conductivity type and having opposing major surfaces,
   b) selectively doping regions in a first major surface with dopant of second conductivity type to form a guard ring of second conductivity type around a device region and at least one plug within the device region of second conductivity type,
   c) forming a silicon oxide layer over the device region,
   d) selectively forming a dopant mask material over areas of the silicon oxide layer where device channel regions are to be formed,
   e) removing the exposed silicon oxide layer thereby forming gate silicon oxide layers,
   f) doping the exposed first major surface not covered by dopant masks with a dopant of a first conductivity type to form source/drain regions between the gate silicon oxide and the guard ring and plug,
   g) etching the dopant mask to expose peripheral portions of the gate oxide,
   h) doping the major surface under the exposed peripheral portion of the gate oxide with dopant of the second conductivity type to form a body region of second conductivity type and channel region which abuts the source/drain region,
   i) forming a first electrode over the first major surface interconnecting the guard ring, doped plugs, source/drain regions, and forming a gate electrode over the gate silicon oxide, and
   j) forming a second electrode over the second major surface contacting the semiconductor substrate.

17. A semiconductor rectifying device made by the method defined by claim 16.

* * * * *